United States Patent
Chung et al.

(10) Patent No.: US 8,872,206 B2
(45) Date of Patent: Oct. 28, 2014

(54) ORGANIC LIGHT EMITTING DISPLAY DEVICE AND METHOD OF MANUFACTURING THE SAME

(75) Inventors: Jin-Koo Chung, Yongin (KR); Jun-Ho Choi, Yongin (KR); Seong-Min Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 152 days.

(21) Appl. No.: 13/316,673

(22) Filed: Dec. 12, 2011

(65) Prior Publication Data
US 2012/0313099 A1    Dec. 13, 2012

(30) Foreign Application Priority Data

Jun. 2, 2011    (KR) .................. 10-2011-0053375

(51) Int. Cl.
*H01L 33/00*    (2010.01)
*H01L 27/32*    (2006.01)
*H01L 51/52*    (2006.01)

(52) U.S. Cl.
CPC ........ *H01L 27/3276* (2013.01); *H01L 27/3279* (2013.01); *H01L 51/5203* (2013.01)
USPC 257/98; 257/88; 257/E33.062; 257/E33.064; 438/29; 438/34

(58) Field of Classification Search
USPC ......... 257/88, 98, E33.062, E33.064; 438/29, 438/34
See application file for complete search history.

(56) References Cited

U.S. PATENT DOCUMENTS 7,026,658 B2    4/2006 Park et al.
7,173,373 B2    2/2007 Yamada et al.
(Continued)

FOREIGN PATENT DOCUMENTS

EP    1722425 A2    11/2006
JP    2007157374 A    6/2007
(Continued)

OTHER PUBLICATIONS

The Extended European Search Report issued by the European Patent Office on May 8, 2013 in the examination of the European Patent Application No. 12154001.7, which corresponds to the Korean Patent Application No. 10-2011-0053375.
(Continued)

*Primary Examiner* — Zandra Smith
*Assistant Examiner* — Jamie C Niesz
(74) *Attorney, Agent, or Firm* — Robert E. Bushnell, Esq.

(57) ABSTRACT

An organic light emitting display device includes a thin film transistor (TFT), a first insulating layer covering the TFT, a first electrode formed on the first insulating layer and electrically connected to the TFT, a second insulating layer that is formed on the first insulating layer and covers the first electrode and has an opening to expose a portion of the first electrode, an organic layer formed on a portion of the second insulating layer and the first electrode, a second electrode formed on the second insulating layer and the organic layer and composed of a first region and a second region, a capping layer formed on a first region of the second electrode and having first edges, and a third electrode formed on a second region of the second electrode and having second edges whose side surfaces contact side surfaces of the first edges of the capping layer.

37 Claims, 12 Drawing Sheets

(56) References Cited

U.S. PATENT DOCUMENTS

| | | |
|---|---|---|
| 2006/0121313 A1 | 6/2006 | Lee et al. |
| 2008/0197778 A1* | 8/2008 | Kubota .......................... 315/73 |
| 2009/0221209 A1 | 9/2009 | Ha et al. |
| 2010/0078627 A1* | 4/2010 | Yoshinaga .................... 257/40 |
| 2010/0102713 A1 | 4/2010 | Seo et al. |
| 2010/0171106 A1 | 7/2010 | Jung et al. |
| 2011/0215329 A1* | 9/2011 | Chung .......................... 257/59 |

FOREIGN PATENT DOCUMENTS

| | | |
|---|---|---|
| JP | 2007165215 A | 6/2007 |
| KR | 100528911 B1 | 11/2005 |
| KR | 10-2006-0062556 A | 6/2006 |
| KR | 10-2008-0074738 | 8/2008 |
| KR | 10-2009-0094639 A | 9/2009 |
| KR | 10-2009-0105208 A | 10/2009 |
| KR | 1020100047457 A | 5/2010 |
| KR | 1020100081773 A | 7/2010 |
| KR | 1020100128794 A | 12/2010 |
| WO | 2008032845 A1 | 3/2008 |

OTHER PUBLICATIONS

KROA issued by KIPO on Oct. 17, 2013 of the corresponding KR Patent Application. No. 10-2011-0053375. "Request for Entry" submitted herewith.

Korean Registration Determination Certificate issued by the Korean Intellectual Property Office on Apr. 23, 2014 in the corresponding Korean Patent Application No. 10-2011-0053375.

* cited by examiner

ORGANIC LIGHT EMITTING DISPLAY DEVICE AND METHOD OF MANUFACTURING THE SAME

CROSS-REFERENCE TO RELATED PATENT APPLICATION

This application makes reference to, incorporates the same herein, and claims all benefits accruing under 35 U.S.C. §119 from an application earlier filed in the Korean Intellectual Property Office on 2 Jun. 2011 and there duly assigned Serial No. 10-2011-0053375.

BACKGROUND OF THE INVENTION

1. Field of the Invention

The present invention relates to an organic light emitting display device and a method of manufacturing the same, and more particularly, to an organic light emitting display device capable of having a large panel and a method of manufacturing the organic light emitting display device.

2. Description of the Related Art

Organic light emitting display devices are self-emission type display devices that emit light by electrically exciting an organic compound, that can be driven at a low voltage and can be thinly manufactured, that have a wide viewing angle and a high response speed, and thus are regarded as next-generation display devices.

Recently, many attempts have been made to embody a large display by using the organic light emitting display device. However, by doing so, a wiring resistance of a common electrode that covers all pixels increases.

Also, in the organic light emitting display device, the common electrode may be damaged by an encapsulation member disposed on the common electrode when the common electrode is used or manufactured, so that it is necessary to protect the common electrode from the encapsulation member.

SUMMARY OF THE INVENTION

The present invention provides an organic light emitting display device and a method of manufacturing the same so as to decrease a wiring resistance of a common electrode and to protect the common electrode.

According to an aspect of the present invention, there is provided an organic light emitting display device including a substrate; a thin film transistor (TFT) formed on the substrate; a first insulating layer covering the TFT; a first electrode formed on the first insulating layer, and electrically connected to the TFT; a second insulating layer formed on the first insulating layer so as to cover the first electrode, and having an opening to expose a portion of the first electrode; an organic emission layer formed on a portion of the second insulating layer, and the first electrode; a second electrode formed on the second insulating layer and the organic emission layer, the second electrode composed of a first region and a second region; a capping layer formed on the first region of the second electrode, and having first edges; and a third electrode formed on the second region of the second electrode, and having second edges whose side surfaces contact side surfaces of the first edges of the capping layer.

The second electrode may be light-transmissive.

The second electrode may include Ag.

The second electrode may include ITO, IZO, ZnO, or $In_2O_3$.

A thickness of the third electrode may be greater than a thickness of the second electrode.

The first region may include a transmission region capable of transmitting external light, and a pixel region that is adjacent to the transmission region and in which emission occurs, the first electrode may overlap with the pixel region, and the first electrode may be positioned so as to block the TFT.

The capping layer may be light-transmissive.

Adhesion strength between the third electrode and the capping layer may be less than adhesion strength between the third electrode and the second electrode.

The capping layer may include 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

The third electrode may include Mg.

According to another aspect of the present invention, there is provided an organic light emitting display device including a plurality of pixels; a plurality of thin film transistors (TFTs) positioned in each of the plurality of pixels; a plurality of first electrodes positioned in the each of the plurality of pixels, and electrically connected to the plurality of TFTs, respectively, a second electrode covering the plurality of pixels; an organic layer disposed between each of the plurality of first electrodes and the second electrode; a plurality of capping layers, each being positioned so as to correspond to at least one of the plurality of pixels; and a third electrode positioned between the plurality of pixels, being adjacent to each of the plurality of capping layers, and electrically connected to the second electrode.

The second electrode may be light-transmissive.

The second electrode may include Ag.

The second electrode may include ITO, IZO, ZnO, or $In_2O_3$.

A thickness of the third electrode may be greater than a thickness of the second electrode.

The each of the plurality of pixels may include a transmission region capable of transmitting external light, and a pixel region that is adjacent to the transmission region and in which emission occurs, the first electrode may overlap with the pixel region, and the first electrode may be positioned so as to block the plurality of TFTs.

The plurality of capping layers may be light-transmissive.

Adhesion strength between the third electrode and the plurality of capping layers may be less than adhesion strength between the third electrode and the second electrode.

Each of the plurality of capping layers may include 8-Quinolinolato Lithium (Liq), N,N-diphenyl-N,N-bis(9-phenyl-9H-carbazol-3-yl)biphenyl-4,4-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

The third electrode may include Mg.

Edges of each of the plurality of capping layers may contact edges of the third electrode.

An area of each of the plurality of capping layers is larger than an area of a region in each of the plurality of pixels, wherein emission occurs in the region.

According to another aspect of the present invention, there is provided a method of manufacturing an organic light emitting display device, the method including the operations of forming a plurality of thin film transistors (TFTs) positioned in each of a plurality of pixels; forming a plurality of organic light emission units that are electrically connected to the plurality of TFTs, respectively, that are positioned in the plurality of pixels, respectively, and that comprise a first electrode, an organic layer, and a second electrode; forming a plurality of capping layers positioned so as to correspond to at least one of the plurality of pixels; and forming a third electrode by depositing metal on the plurality of pixels, wherein the third electrode is adjacent to each of the plurality of capping layers and is electrically connected to the second electrode.

The second electrode may be light-transmissive.

The second electrode may include Ag.

The second electrode may include ITO, IZO, ZnO, or $In_2O_3$.

The third electrode may be formed to have a greater thickness than the second electrode.

The each of the plurality of pixels may include a transmission region capable of transmitting external light, and a pixel region that is adjacent to the transmission region and in which emission occurs, the first electrode may overlap with the pixel region, and the first electrode may be positioned so as to block the plurality of TFTs.

The plurality of capping layers may be light-transmissive.

Adhesion strength between a material to form the third electrode and the plurality of capping layers may be less than adhesion strength between the material to form the third electrode and the second electrode.

Each of the plurality of capping layers may include 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di (naphthalene-2-yl)anthracene-2-yl)phenyl)-1-phenyl-1H-benzo-[D]imidazole (LG201).

The third electrode may include Mg.

The operation of forming the plurality of capping layers may include the operation of using a mask having an opening with a pattern that corresponds to the plurality of capping layers.

The operation of forming the third electrode may include the operation of depositing the metal on the plurality of capping layers and on regions adjacent to the plurality of capping layers.

An area of each of the plurality of capping layers may be larger than an area of a region in each of the plurality of pixels, wherein emission occurs in the region.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, the present invention will be described in detail by explaining exemplary embodiments of the invention with reference to the attached drawings.

Figure 1:
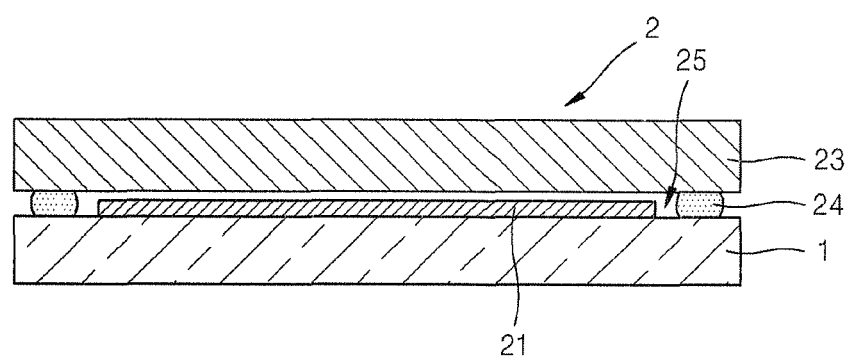
FIG. 1 is a cross-sectional view illustrating an organic light emitting display device according to an embodiment of the present invention.

FIG. 1 is a cross-sectional view illustrating an organic light emitting display device according to an embodiment of the present invention.

Referring to FIG. 1, the organic light emitting display device 2 includes an organic light emission unit 21 formed on a substrate 1, and a sealing substrate 23 sealing the organic light emission unit 21.

The sealing substrate 23 is formed of a transparent material so as to allow an image from the organic light emission unit 21 to be realized, and functions to prevent external air and moisture from penetrating into the organic light emission unit 21.

Side edges of the substrate 1 and the sealing substrate 23 are bonded by a sealing member 24, so that a space 25 between the substrate 1 and the sealing substrate 23 is sealed.

In the space 25, an absorbent or a filler may exist.

Figure 2:
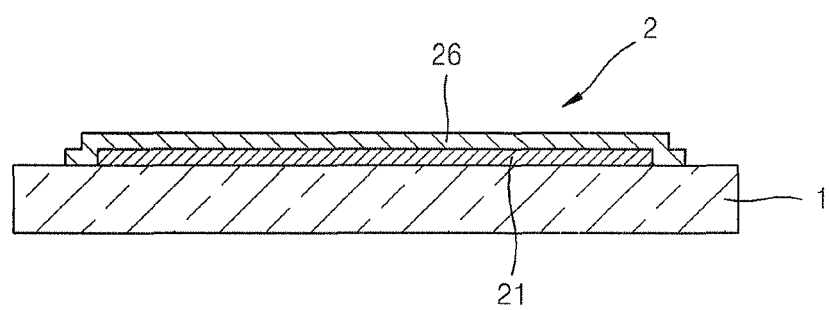
FIG. 2 is a cross-sectional view illustrating an organic light emitting display device according to another embodiment of the present invention.

Instead of using the sealing substrate 23, as illustrated in FIG. 2, a sealing film 26 may be formed on the organic light emission unit 21 so that the organic light emission unit 21 may be protected from the outside. The sealing film 26 may have a structure in which a layer that is formed of an inorganic material including silicon oxide or silicon nitride and a layer that is formed of an organic material including epoxy or polyimide are alternately formed. However, the structure of the sealing film 26 is not limited thereto and thus may have any sealing structure formed on a transparent thin film.

Figure 3:
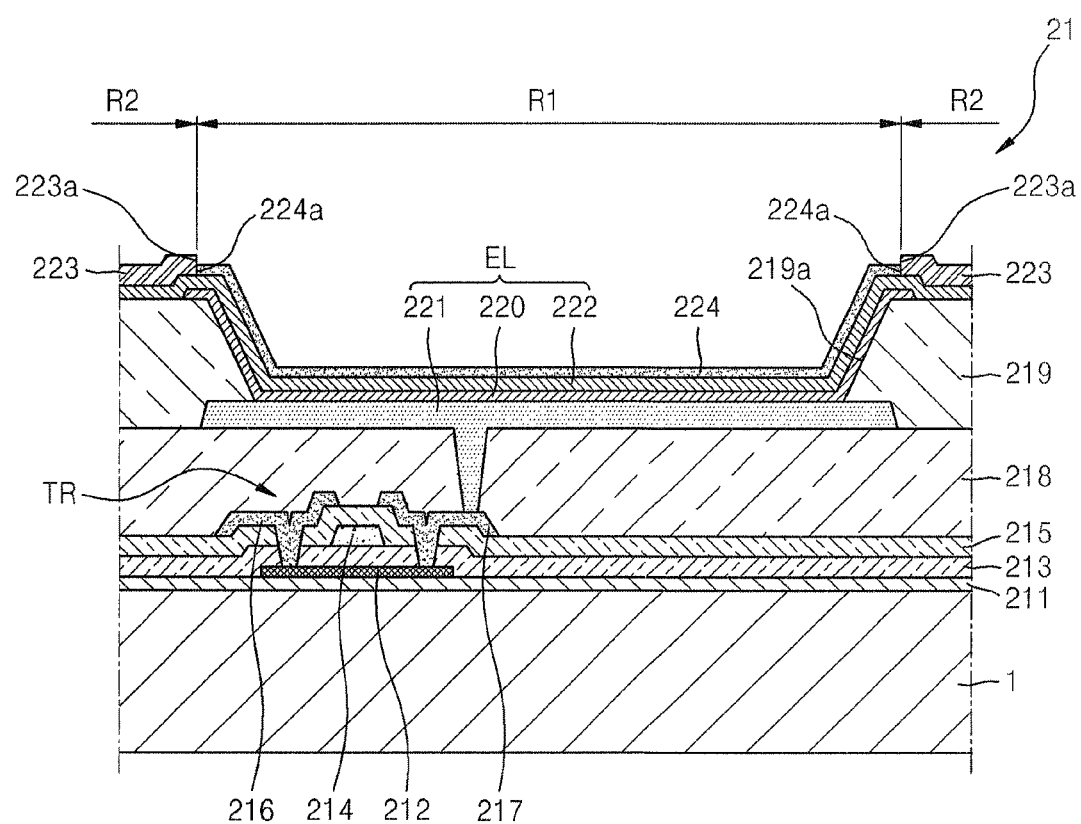
FIG. 3 is a cross-sectional view illustrating an organic light emission unit of FIG. 1 or 2, according to an embodiment of the present invention.

FIG. 3 is a cross-sectional view illustrating the organic light emission unit 21 of FIG. 1 or 2, according to an embodiment of the present invention. FIG. 3 illustrates one pixel of the organic light emission unit 21, and the organic light emission unit 21 has a plurality of the pixels.

Referring to the present embodiment of FIG. 3, a buffer layer 211 is formed on one surface of the substrate 1, and a thin film transistor (TFT) TR is formed on the buffer layer 211.

Although the embodiment of FIG. 3 includes only one TFT TR, the pixel may form a pixel circuit by having one or more TFTs and capacitors.

A semiconductor active layer 212 is formed on the buffer layer 211.

The buffer layer 211 functions to prevent penetration of foreign materials and to planarize a surface of the substrate 1, and may be formed by using one of various materials capable of performing the functions. For example, the buffer layer 211 may be formed of an inorganic material including silicon oxide, silicon nitride, silicon oxynitride, aluminum oxide, aluminum nitride, titanium oxide or titanium nitride, an organic material including polyimide, polyester, or acryl, or a multi-stack of these. The buffer layer 211 may not be formed optionally.

The semiconductor active layer 212 may be formed of polycrystalline silicon but is not limited thereto and thus may be formed of an oxide semiconductor. For example, the semiconductor active layer 212 may have a G-I-Z-O layer [$(In_2O_3)a(Ga_2O_3)_b(ZnO)c$ layer] (where a, b, c are real numbers that satisfy $a \geq 0$, $b \geq 0$, $c \geq 0$, respectively).

A gate insulating layer 213 is formed on the buffer layer 211 so as to cover the semiconductor active layer 212, and a gate electrode 214 is formed on the gate insulating layer 213.

An interlayer insulating layer 215 is formed on the gate insulating layer 213 so as to cover the gate electrode 214, and a source electrode 216 and a drain electrode 217 are formed on the interlayer insulating layer 215 so as to respectively contact the semiconductor active layer 212 via contact holes.

However, a structure of the TFT TR is not limited to the aforementioned structure and thus may have one of various TFT structures. For example, while the TFT TR has a top gate structure, the TFT TR may have a bottom gate structure in which the gate electrode 214 is disposed below the semiconductor active layer 212. In this regard, one of various and available TFT structures may be applied to the TFT TR.

A pixel circuit (not shown) including the TFT TR and a capacitor may be formed.

A first insulating layer 218 is formed to cover the pixel circuit including the TFT TR. The first insulating layer 218 may be an insulating layer having a single or a plurality of layers whose top surface is planarized. The first insulating layer 218 may be formed of an inorganic material and/or an organic material.

As illustrated in FIG. 3, a first electrode 221 that is electrically connected to the pixel circuit including the TFT TR is formed on the first insulating layer 218. The first electrode has an island form that is separate in each pixel.

A second insulating layer 219 is formed on the first insulating layer 218 so as to cover edges of the first electrode 221. An opening 219a is formed on the second insulating layer 219, thereby opening a central portion of the first electrode 221 except for the edges of the first electrode 221.

An organic layer 220 is formed on the first electrode 221 exposed via the opening 219a, and a second electrode 222 is formed to cover the organic layer 220, so that an organic light emitting diode EL is formed.

The organic layer 220 may be formed as a small-molecule organic layer or a polymer organic layer. When the organic layer 220 is formed as the small-molecule organic layer, the organic layer 220 may have a structure in which a Hole Injection Layer (HIL), a Hole Transport Layer (HTL), an emission layer (EML), an Electron Transport Layer (ETL), an Electron Injection Layer (EIL) or the like are singularly or multiply stacked. The small-molecule organic layer may be formed by vacuum deposition. Here, the EML may be independently formed in each of red, green, and blue pixels, and the HIL, the HTL, the ETL, and the EIL are common layers that may be commonly applied to the red, green, and blue pixels.

The HIL may be formed of a phthalocyanine compound including copper phthalocyanine, or TCTA, m-MTDATA, m-MTDAPB, or the like, which are a starburst-type amine.

The HTL may be formed of N,N'-bis(3-methylphenyl)-N, N'-diphenyl-[1,1-biphenyl]-4,4'-diamine (TPD), N,N'-di(naphthalene-1-yl)-N,N'-diphenyl benzidine (α-NPD), or the like.

The EIL may be formed of lithium fluoride (LiF), sodium chloride (NaCl), caesium fluoride (CsF), lithium oxide (Li2O), barium oxide (BaO), or Liq.

The ETL may be formed of aluminum tris(8-hydroxyquinoline) (Alq3).

The EML may include a host material and a dopant material.

Examples of the host material may include tris(8-hydroxyquinolinato)aluminum (Alq3), 9,10-di(naphth-2-yl)anthracene (AND), 3-tert-butyl-9,10-di(naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene(BSDF), 2,7-bis(9,9'-spirobifluorene-2-yl)-9, 9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4''-tris(carbazol-9-yl) triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP), or the like.

Examples of the dopant material may include 4,4'-bis[4-(di-p-tolylamino)styryl]biphenyl (DPAVBi), 9,10-di(naph-2-tyl)anthracene (ADN), 3-tert-butyl-9,10-di(naph-2-tyl)anthracene (TBADN), or the like.

The first electrode 221 may functions as an anode electrode, and the second electrode may function as a cathode electrode. Obviously, polarities of the first electrode 221 and the second electrode 222 may be reversed.

In a case where the first electrode 221 functions as an anode electrode, the first electrode 221 may be formed of a material having a high work function and may include ITO, IZO, ZnO, or $In_2O_3$. In a case where the organic light emitting display device of FIG. 3 is a top emission type organic light emitting display device in which an image is realized away from the substrate 1, the first electrode 221 may further include a reflective layer formed of silver (Ag), magnesium (Mg), aluminum (Al), platinum (Pt), palladium (Pd), gold (Au), nickel (Ni), neodymium (Nd), iridium (Ir), chromium (Cr), lithium (Li), or calcium (Ca).

In a case where the second electrode 222 functions as a cathode electrode, the second electrode 222 may be formed of a metal material including Ag, Mg, Al, Pt, Pd, Au, Ni, Nd, Ir, Cr, Li, or Ca. In a case where the organic light emitting display device of FIG. 3 is the top emission type organic light emitting display device, it is necessary for the second electrode to be light-transmissive. To do so, the second electrode 222 may include ITO, IZO, ZnO, or $In_2O_3$, which are transparent metal oxide. Also, the second electrode 222 may be formed as a thin film by using Al, Ag and/or Mg. For example, the second electrode 222 may have a structure in which an alloy of Mg and Ag and/or Ag is singularly or multiply stacked. Unlike the first electrode 221, the second electrode 222 is formed to apply a common voltage to all pixels, and to do so, the second electrode 222 is formed as a common electrode that is not patterned for each of pixels. However, the second electrode 222 may be patterned according to a mesh pattern, so that all regions of the second electrode 222 are removed except for a region of the second electrode 222 which corresponds to an emission region.

In a case where the organic light emitting display device of FIG. 3 is the top emission type organic light emitting display device, the second electrode 222 includes transparent metal oxide and/or thin metal, so that, if the second electrode 222 is formed as the common electrode, a sheet resistance of the second electrode 222 increases and thus a voltage drop occurs. In order to solve this problem, according to the present embodiment, a third electrode 223 is further formed on the second electrode 222 to be electrically connected to the second electrode 222.

Also, there is a risk that a top surface of the second electrode 222 is damaged by the sealing substrate 23 of FIG. 1. In addition, in a case where the sealing film 26 is formed as shown in FIG. 2, the second electrode 222 may be damaged when the sealing film 26 is formed. In order to solve this problem, according to the present embodiment, a capping layer 224 is formed on the second electrode 222.

The capping layer 224 is formed on a first region R1 of the second electrode 222, and has first edges 224a.

The third electrode 223 is formed on a second region R2 of the second electrode 222, and has second edges 223a. The third electrode 223 is in parallel with the portion of the capping layer 224 formed on the region where the second insulating layer 219 is not formed and is adjacent to the capping layer 224.

The first region R1 is larger than an area of a region in which emission occurs in at least one pixel, and the first region R1 covers the region in which emission occurs in at least one pixel. The capping layer 224 is formed entirely on the first region R1, and edges of the first region R1 corresponds to the first edges 224a of the capping layer 224. Also, the second region R2 corresponds to a region of the second electrode 222 other than a region corresponding to the first region R1, and in this regard, the third electrode 223 is formed entirely on the second region R2, and edges of the second region R2 corresponds to the second edges 223a of the third electrode 223. The second region R2 corresponds to a region except for the region in which emission occurs.

Side surfaces of the first side edges 224a of the capping layer 224 contact side surfaces of the second side edges 223a of the third electrode 223.

In order to decrease a sheet resistance of the second electrode 222, a thickness of the third electrode 223 may be greater than a thickness of the second electrode 222.

Since the capping layer 224 covers the region in which emission occurs in at least one pixel, the capping layer 224 may be formed to be light-transmissive. The capping layer 224 may be formed as a thin film whose thickness is less than the third electrode 223 but is not limited thereto.

In the present embodiment, adhesion strength between the third electrode 223 and the capping layer 224 may be less than adhesion strength between the third electrode 223 and the second electrode 222.

To do so, the capping layer 224 may be formed of 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), 2-(4-(9,10-di(naphthalene-2-yl)anthracene-2-yl)phenyl)-1-phenyl-1H-benzo-[D] imidazole (LG201), or the like.

The third electrode 223 may be formed of Mg.

Since the third electrode 223 and the second electrode 222 include Mg, they have excellent adhesion. However, Mg is not bonded well to the aforementioned material that forms the capping layer 224. Thus, by using an adhesion characteristic between the third electrode 223 and the capping layer 224, the third electrode 223 may be easily patterned.

As described above, the third electrode 223 has to be patterned so as to be formed only on the second region R2. However, after the organic layer 220 of the organic EL device is formed, it is not possible to pattern the third electrode 223 by using a wet process such as photolithography that is commonly used to pattern a metal layer. This is because a lifetime of the organic EL device is sharply decreased when moisture and/or oxygen penetrates into the organic layer 220 due to the wet process.

Thus, it is very difficult to pattern the third electrode 223 in an actual process.

However, according to the present embodiment, the third electrode 223 may be easily patterned by using the adhesion characteristic between the third electrode 223 and the capping layer 224. Hereinafter, this patterning method will now be described in detail.

Figure 4:
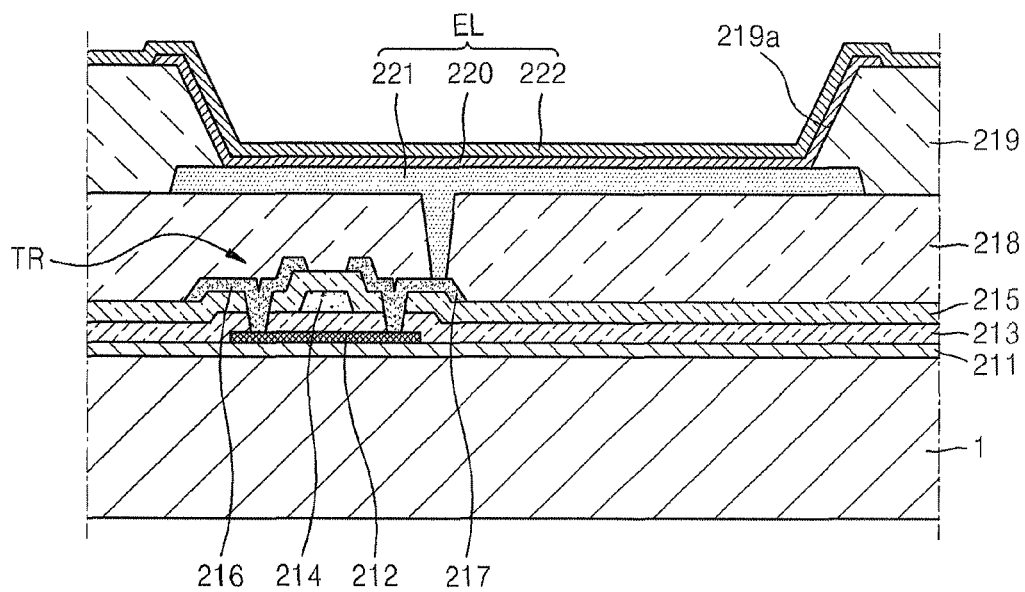
FIGS. 4 through 6 are cross-sectional views illustrating a method of manufacturing an organic light emitting display device, according to an embodiment of the present invention.
Figure 5:
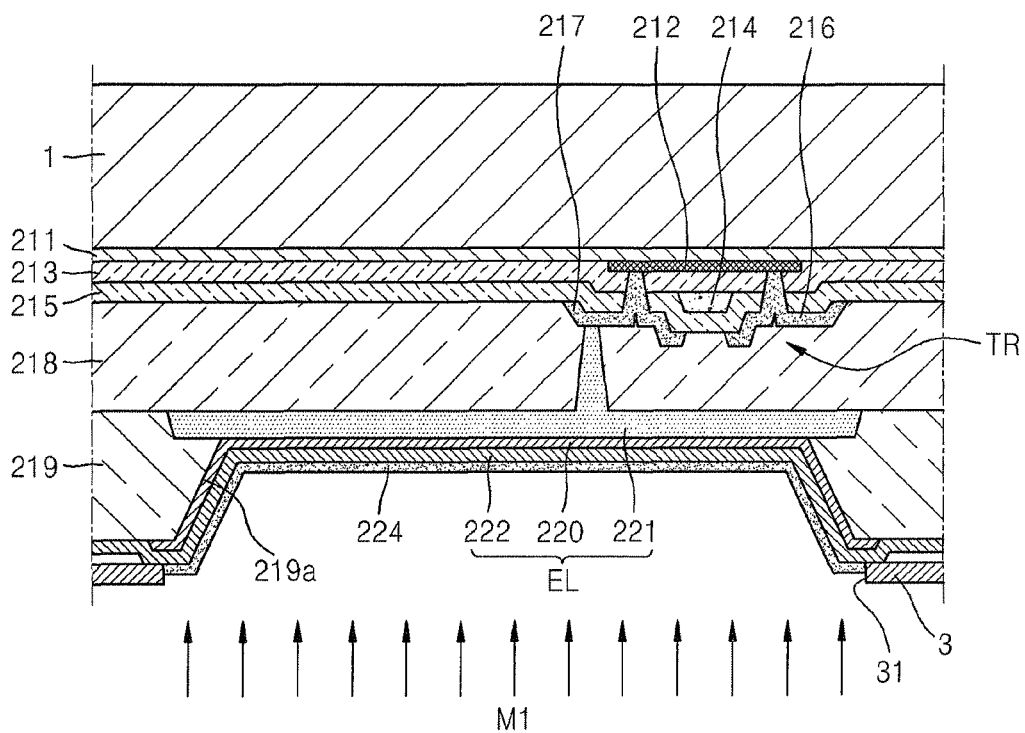

First, as illustrated in FIG. 4, after the second electrode 222 is formed, and, as illustrated in FIG. 5, the capping layer 224 is formed by using a mask 3. The capping layer may be formed by using the aforementioned organic material, so that the capping layer may be formed by a thermal evaporation method using the mask 3. An opening 31 is formed in the mask 3 so as to correspond to a pattern of the capping layer 224, and a material M1 to form the capping layer 224 is deposited via the opening 31, so that the capping layer is formed on the second electrode 222.

Figure 6:
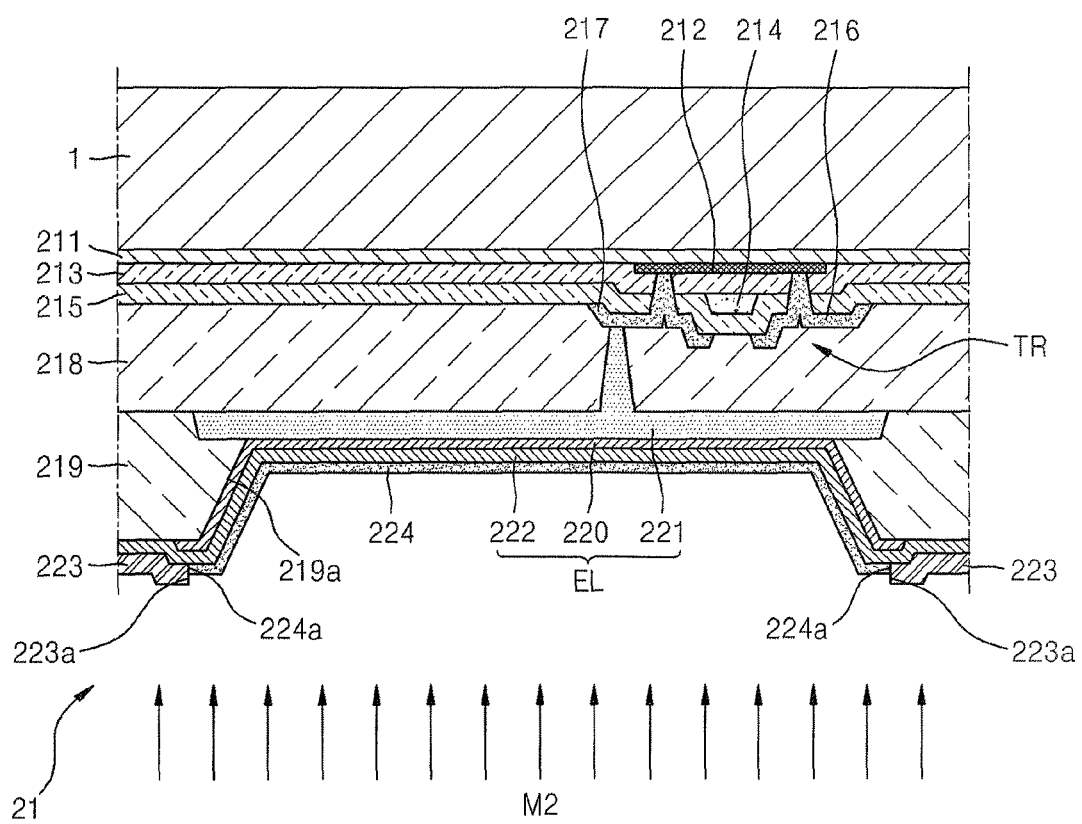

Next, as illustrated in FIG. 6, a material M2 to form the third electrode 223 is formed. Although not illustrated, the material M2 may be formed by using an open mask that is open to all pixels or may be formed without a mask.

In this case, the material M2 to form the third electrode 223 is not formed on the capping layer 224 due to weak adhesion between the material M2 and the capping layer 224, and is formed only on the second electrode 222 having relatively great adhesion with the material M2.

Thus, the third electrode 223 may be naturally patterned without a separate mask or a separate patterning process.

Figure 7:
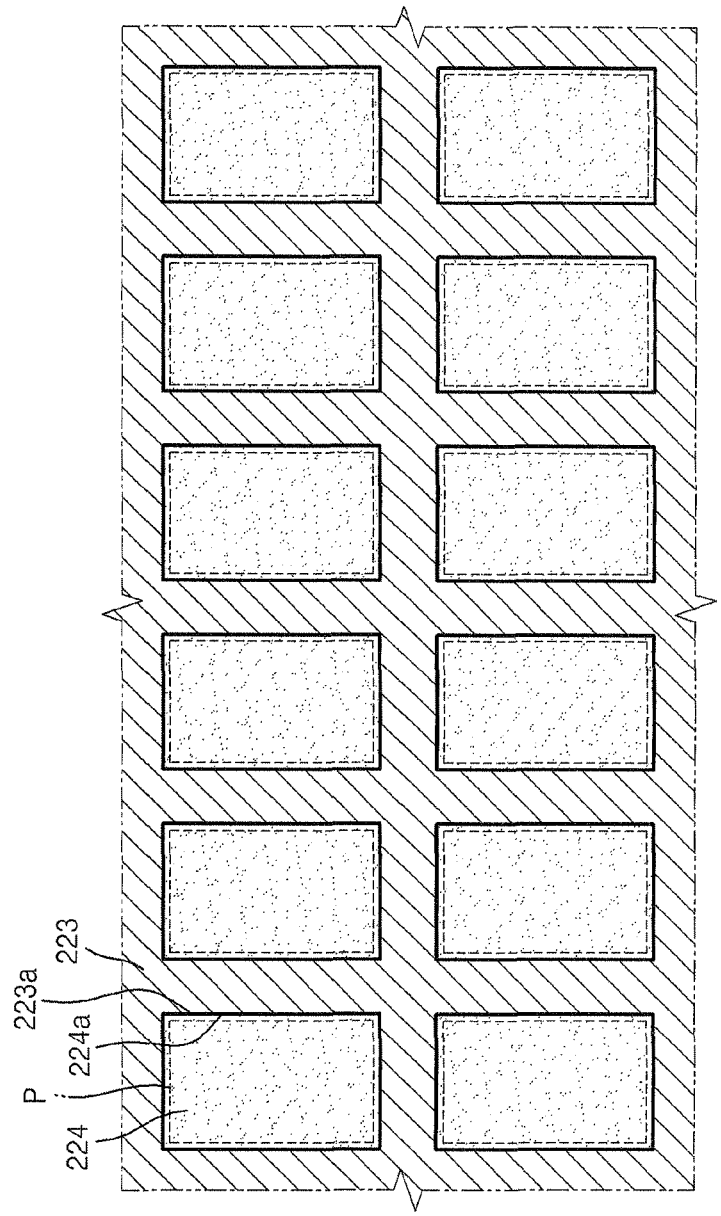
FIG. 7 is a plane view illustrating an organic light emission unit, according to another embodiment of the present invention.

As illustrated in FIG. 7, the capping layer 224 may have an island shape that is separate in each of pixels P. Referring to FIG. 7, the capping layer 224 has an area that completely covers one pixel P. However, the capping layer 224 is not limited thereto and thus it is acceptable if the capping layer 224 has an area that covers a region of one pixel P in which emission occurs.

In this case, the third electrode 223 forms a lattice pattern between the pixels P.

Figure 8:
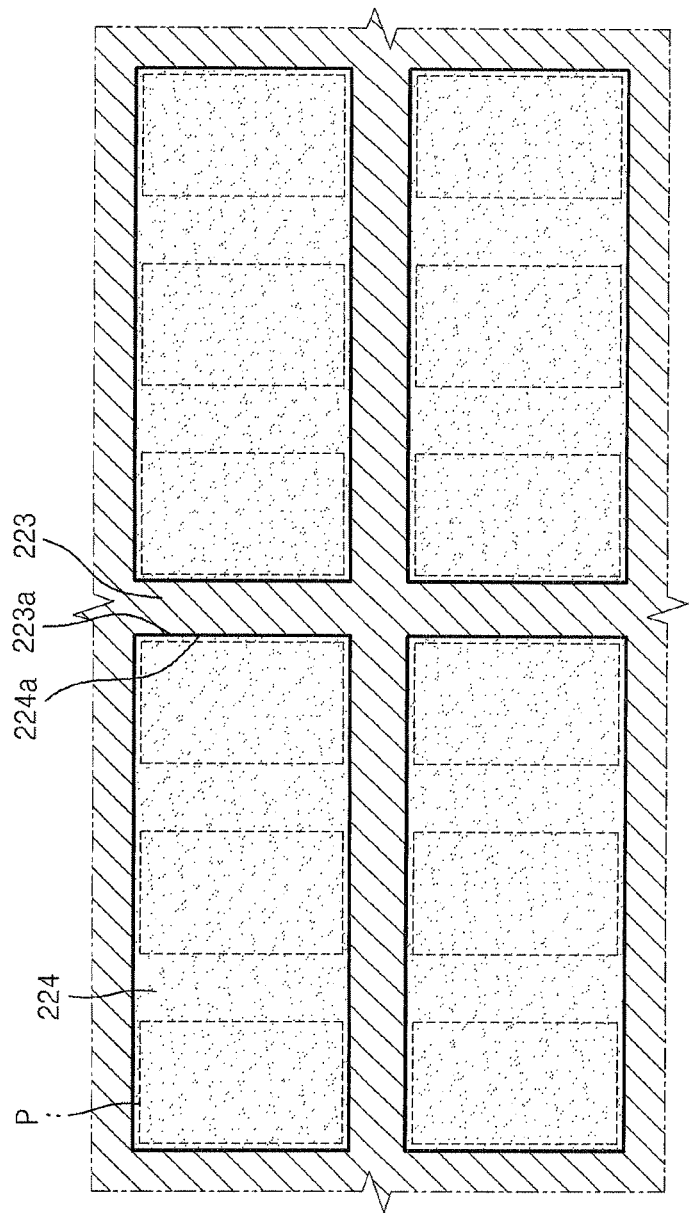
FIG. 8 is a plane view illustrating an organic light emission unit, according to another embodiment of the present invention.

As illustrated in FIG. 8, the capping layer 224 may have an island form that is separate in each group of a plurality of pixels P. In this case, the third electrode 223 forms a lattice pattern between groups of the plurality of pixels P.

Figure 9:
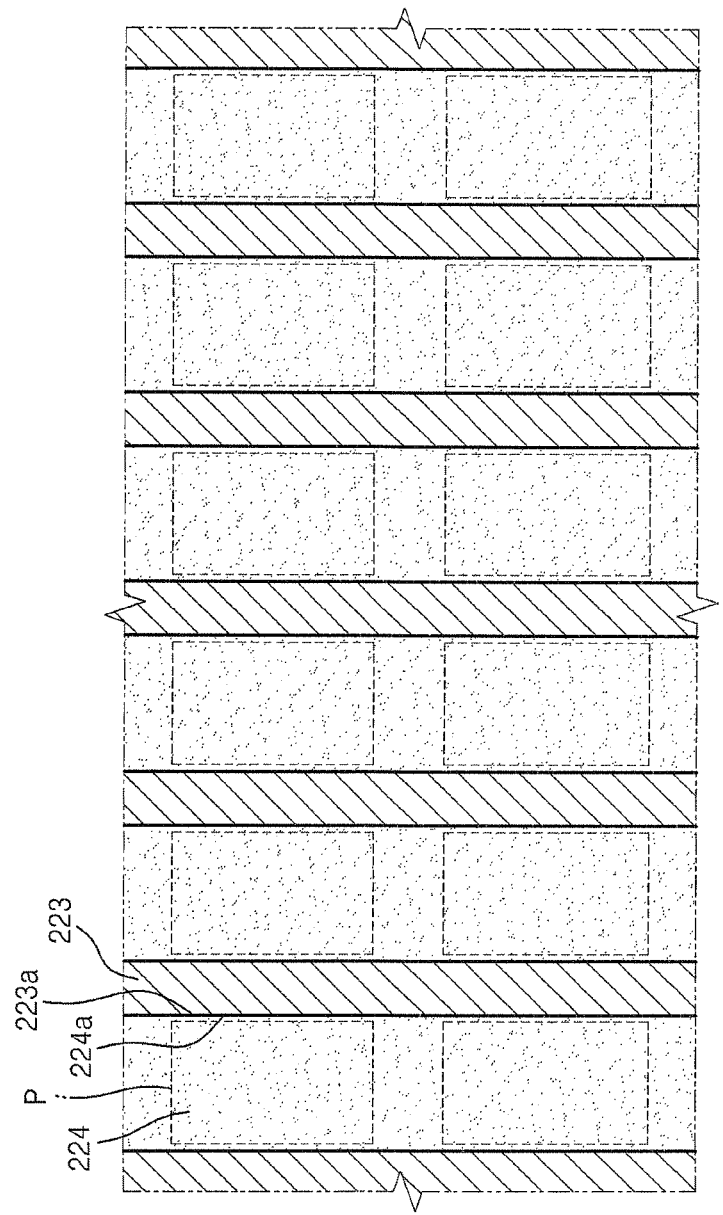
FIG. 9 is a plane view illustrating an organic light emission unit, according to another embodiment of the present invention.

As illustrated in FIG. 9, the capping layer 224 may have a stripe form so as to cover a plurality of pixels P that are disposed in series. In this case, the third electrode 223 forms a stripe pattern between rows of pixels.

In another embodiment of FIG. 9, although not illustrated, the capping layer 224 may have a stripe form so as to further cover a plurality of pixels P in a horizontal direction.

Figure 10:
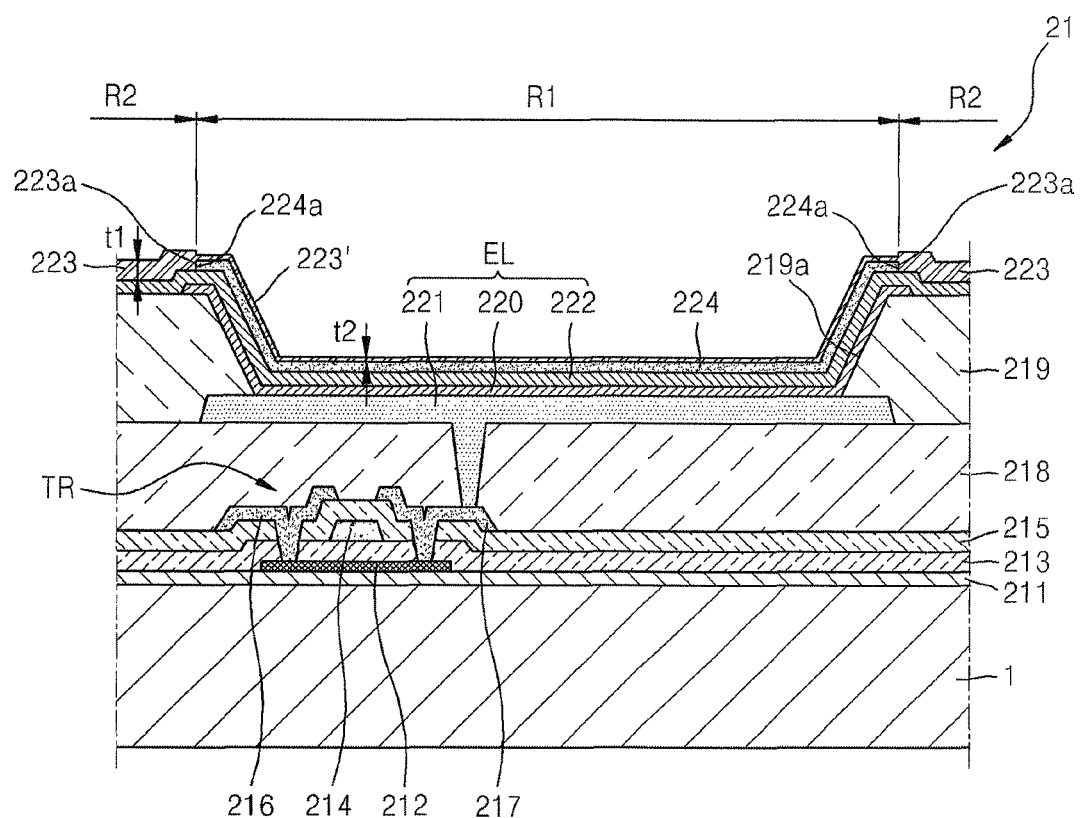
FIG. 10 is a cross-sectional view illustrating an organic light emission unit, according to another embodiment of the present invention.

When the material M2 to form the third electrode 223 is deposited as shown in FIG. 6, the third electrode 223 is formed on the region except for the capping layer 224 but also, as illustrated in FIG. 10, a thin film 223' having a second thickness t2 that is less than a first thickness t1 of the third electrode 223 formed on the region except for the capping layer 224 may be formed on the capping layer 224. In this regard, it is theoretical that the material M2 to form the third electrode 223 has weak adhesion with the capping layer 224 so that the material M2 is not formed on the capping layer 224 and is formed only on the second electrode 222 having great adhesion with the material M2. When deposition is actually performed by using the open mask, without a separate patterning mask, as illustrated in FIG. 6, the thin film 223' having the second thickness t2 may be thinly formed on the capping layer 224 even if it is theoretical the material M2 is not formed on the capping layer 224.

Since the second thickness t2 is less than the first thickness t1, the second thickness t2 may not significantly affect brightness of the organic EL device in the first region R1.

Figure 11:
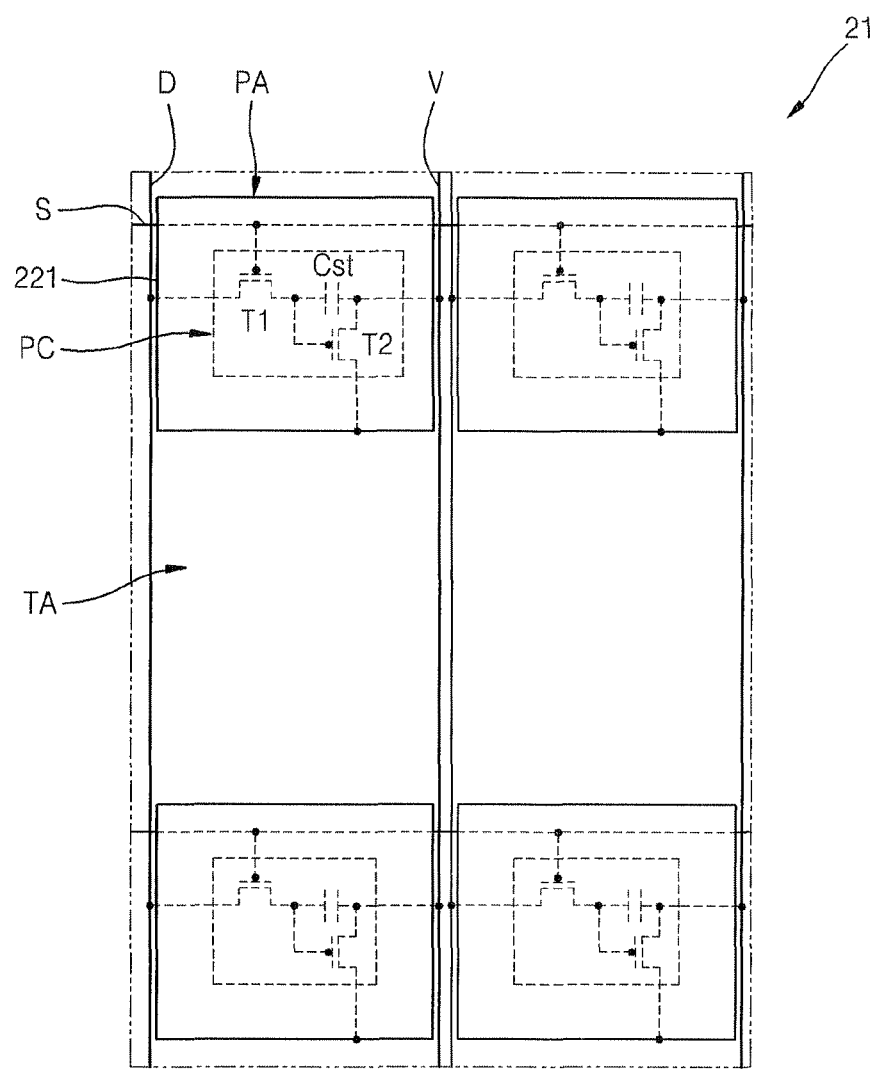
FIG. 11 is a plane view illustrating an organic light emission unit, according to another embodiment of the present invention.
Figure 12:
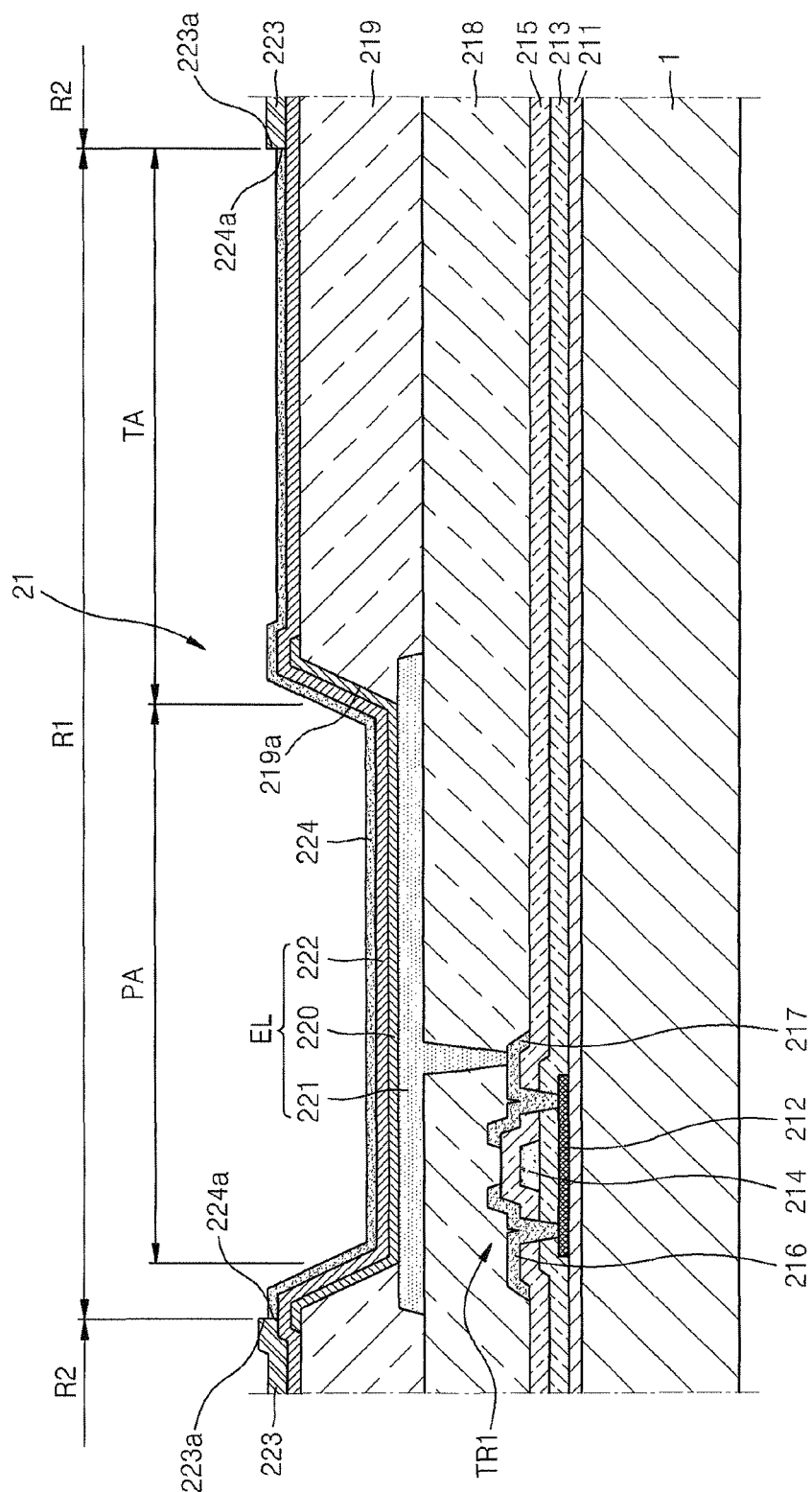
FIG. 12 is a cross-sectional view illustrating one pixel of FIG. 11.

FIG. 11 is a plane view of an organic light emission unit 21 of an organic light emitting display device, according to another embodiment of the present invention. FIG. 12 is a cross-sectional view illustrating one pixel of FIG. 11.

Referring to the present embodiment of FIGS. 11 and 12, the organic light emission unit 21 is defined by a transmission region TA for transmitting external light, and a plurality of pixel regions PA that are separate from each other by having the transmission region TA disposed therebetween.

As illustrated in FIG. 11, a pixel circuit unit PC is disposed in each of the pixel regions PA, and a plurality of conductive lines including a scan line S, a data line D, a Vdd line V, and the like are electrically connected to the pixel circuit unit PC. Although not illustrated, according to a configuration of the pixel circuit unit PC, various conductive lines in addition to the scan line S, the data line D, and the Vdd line V may be further arranged.

As illustrated in FIG. 11, the pixel circuit unit PC includes a first TFT T1 connected to the scan line S and the data line D, a second TFT T2 connected to the first TFT T1 and the Vdd line V, and a capacitor Cst connected to the first TFT T1 and the second TFT T2. Here, the first TFT T1 becomes a switching transistor, and the second TFT T2 becomes a driving transistor. The second TFT T2 is electrically connected to the first electrode 221. In the embodiment of FIG. 11, the first TFT T1 and the second TFT T2 may be a P-type but they are not limited thereto and thus at least one of them may be an N-type. The number of the TFT and the capacitor is not limited to that of the present embodiment and thus according to the pixel circuit unit PC, two or more transistors and one or more capacitors may be coupled.

Referring to FIG. 11, the scan line S is disposed to overlap with the first electrode 221. However, one or more embodiments are not limited thereto and thus at least one of the plurality of conductive lines including the scan line S, the data line D, and the Vdd line V may be disposed to overlap with the first electrode 221, and it is also possible that all of the plurality of conductive lines including the scan line S, the data line D, and the Vdd line V may overlap with the first electrode 221 or may be disposed to be adjacent to the first electrode 221.

According to the present embodiment, the pixel region PA and the transmission region TA are separated so that, when an external image is viewed via the transmission region TA, it is possible to prevent external image distortion due to that external light is scattered with respect to a pattern of devices in the pixel circuit unit PC.

The pixel region PA and the transmission region TA are formed in such a manner that a ratio of a total area of the pixel region PA and the transmission region TA to an area of the transmission region TA is between about 5% and about 90%.

When the ratio of the area of the transmission region TA to the total area of the pixel region PA and the transmission region TA is less than 5%, only a small amount of light passes through the organic light emission unit 21 so that it is difficult for a user to view an object or an image, which is positioned in an opposite side. That is, the organic light emission unit 21 is not transparent. However, although the ratio of the area of the transmission region TA to the total area of the pixel region PA and the transmission region TA is about 5%, an intensity of actual external light is great, a user may completely recognize an object or an image, which is positioned in an opposite side, via a display, so that the display may function as a transparent display to the user. As will be described later, when a TFT included in the pixel circuit unit PC is formed as a transparent TFT such as an oxide semiconductor, and an organic EL device is formed as a transparent device, a recognition level of a transparent display may increase.

When the ratio of the area of the transmission region TA to the total area of the pixel region PA and the transmission region TA is greater than 90%, pixel integrity of the organic light emission unit 21 is significantly decreased such that it is difficult to realize a stable image via emission in the pixel region PA. That is, as an area of the pixel region PA is decreased, brightness of light emitting from the organic layer 220 has to be increased so as to realize an image. Thus, when the organic EL device operates in a high brightness status, a lifetime of the organic EL device is sharply decreased.

The ratio of the area of the transmission region TA to the total area of the pixel region PA and the transmission region TA may be in the range of about 20% and about 70%.

In a range below 20%, the area of the pixel region PA is too large, compared to the area of the transmission region TA, so that there is limitation to a user that views an external image via the transmission region TA. In a range above 70%, many restrictions occur in a design of the pixel circuit unit PC to be disposed in the pixel region PA.

The first electrode 221 that is electrically connected to the pixel circuit unit PC is arranged in the pixel region PA, and the pixel circuit unit PC overlaps with the first electrode 221 so as to be blocked by the first electrode 221. Then, at least one of the plurality of conductive lines including the scan line S, the data line D, and the Vdd line V may be disposed to overlap with the first electrode 221. In this regard, since the plurality of conductive lines do not significantly deteriorate transmittance, compared to the pixel circuit unit PC, according to a design condition, all of the plurality of conductive lines may be disposed to be adjacent to the first electrode 221.

As described above, in a case where the first electrode 221 includes the reflective layer formed of conductive metal capable of reflecting light, the first electrode 221 blocks the pixel circuit unit PC, and prevents external image distortion due to the pixel circuit unit PC in the pixel region PA.

As illustrated in FIG. 12, the pixel region PA and the transmission region TA are positioned in the first region R1.

Here, since a capping layer 224 is positioned in the first region R1, the capping layer covers the pixel region PA and the transmission region TA. Also, a third electrode 223 is arranged in the second region R2 that is at a side of the first region R1.

In the present embodiment, the capping layer 224 is formed of a transparent organic material, so that the capping layer 224 may not affect transmittance in the transmission region TA.

Materials and forming methods with respect to the capping layer 224 and the third electrode 223 are the same as those of the previous embodiments.

Although not illustrated, a transmissive window may be formed in the transmission region TA by removing a portion of the second electrode 222, so that the transmittance in the transmission region TA may be further increased. Here, the transmissive window may be formed by not only removing the second electrode 222 but also formed on at least one of a second insulating layer 219, a first insulating layer 218, an interlayer insulating layer 215, a gate insulating layer 213, and a buffer layer 211.

Figure 13:
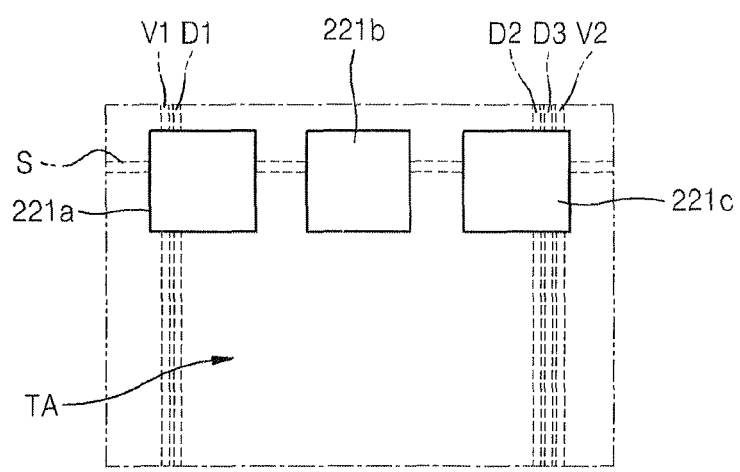
FIG. 13 is a plane view illustrating an organic light emission unit, according to another embodiment of the present invention.

FIG. 13 illustrates a transparent organic light emitting display device of FIGS. 11 and 12, according to another embodiment of the present invention.

The embodiment of FIG. 13 corresponds to a case in which one pixel is implemented by three sub-pixels including red, green, and blue sub-pixels, so that white light is emitted. In this regard, the embodiment of FIG. 13 includes a case in which white light is emitted by sub-pixels having colors other than red, green, and blue colors.

In this case, one transmission region TA is formed per a group of first electrodes 221a, 221b, and 221c of the three sub-pixels. A first data line D1 through a third data line D3 are electrically connected to the first electrodes 221a, 221b, and 221c of the three sub-pixels, respectively. Also, a first Vdd line V1 is electrically connected to the first and second first electrodes 221a and 221b, and a second Vdd line V2 is electrically connected to the third first electrode 221c.

In this structure, one large transmission region TA is formed with respect to a plurality of sub-pixels, so that transmittance of an entire display may be further increased, and image distortion due to scattered light may be further decreased.

Although not illustrated in FIG. 13, one large transmissive window may be formed in the transmission region TA by removing a portion of a second electrode, so that transmittance in the transmission region TA may be further increased. Here, the transmissive window may be formed by not only removing the second electrode but also formed on at least one of a second insulating layer, a first insulating layer, an interlayer insulating layer, a gate insulating layer, and a buffer layer.

In the embodiment of FIGS. 11 through 13, a thin film having a small thickness and formed of a material to form a third electrode may be formed on a capping layer 224 of a first region R1, as in the embodiment of FIG. 11. In this case, as described above, the thickness of the thin film is very small so that the thin film may not affect the transmittance in the transmission region TA.

Figure 14:
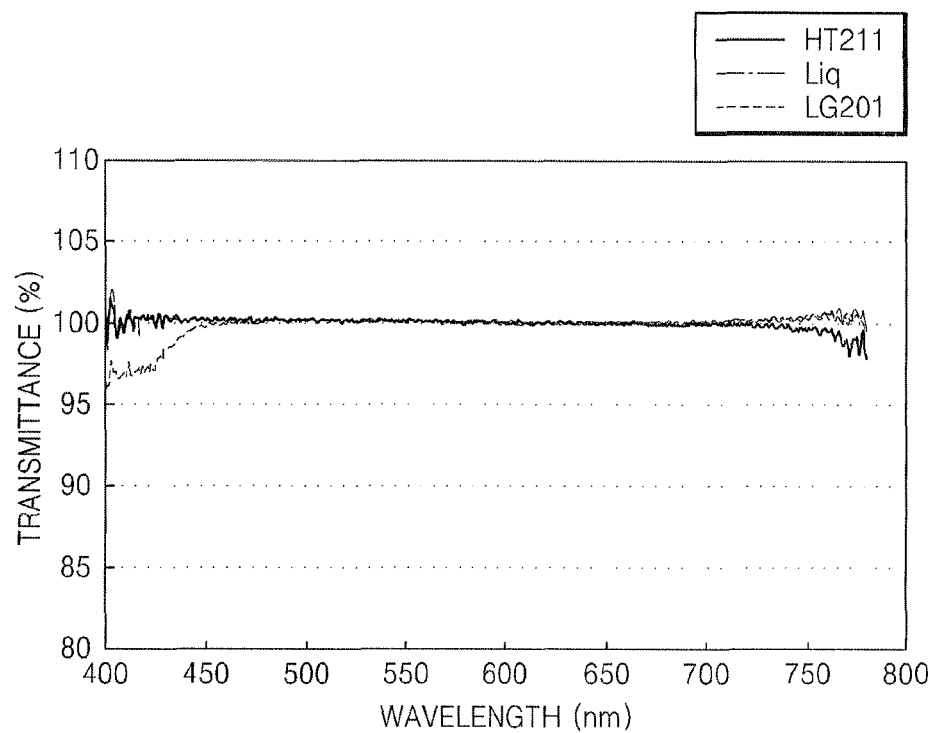
FIG. 14 is a graph illustrating transmittance in a pixel emission region, when a capping layer and a third electrode are formed by the method according to the one or more embodiments of the present invention.

FIG. 14 is a graph illustrating transmittance in a pixel emission region, when a capping layer 224 and a third electrode 223 are formed by the method of FIGS. 4 through 7.

The capping layer 224 was formed of the aforementioned capping layer material and was deposited with a thickness of 30 Å. The third electrode 223 was formed by depositing Mg on an entire pixel region by using an open mask, and in this regard, 1000 Å of Mg was deposited.

As illustrated in FIG. 14, it is possible to see that almost 100% transmittance is shown in an entire wavelength region of visible light. This means that, as described above, Mg was hardly deposited on a region where the capping layer 224 was formed.

Thus, according to the one or more embodiments, the capping layer 224 and the third electrode 223 may be effectively formed without a loss of light.

Figure 15:
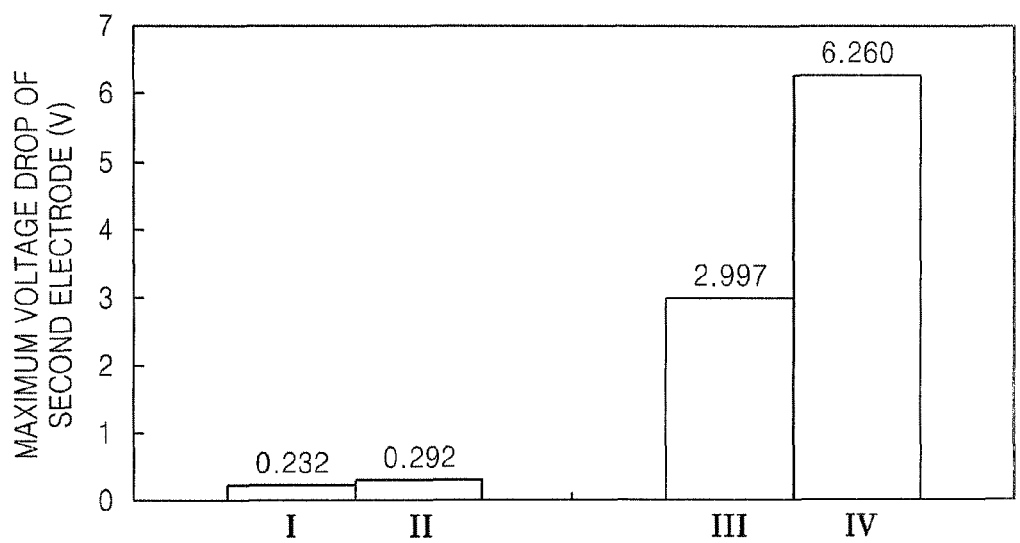
FIG. 15 is a graph illustrating an amount of a maximum voltage drop of a second electrode, when a third electrode is formed by the method according to the one or more embodiments of the present invention.

FIG. 15 is a graph illustrating an amount of a maximum voltage drop of the second electrode 222, when the third electrode 223 is formed by the methods according to the one or more embodiments. In each test example, the second electrode 222 was formed of Mg:Ag/Ag, and had a sheet resistance of 20 ohm/sq.

A test example I corresponds to a case in which the capping layer 224 and the third electrode 223 were formed in a display having a size of 19 inches according to the embodiment of FIGS. 3 and 7. Here, the third electrode 223 was formed by depositing Mg of 3,500 Å.

A test example II corresponds to a case in which the capping layer 224 and the third electrode 223 were formed in a display having a size of 40 inches according to the embodiment of FIGS. 3 and 7. Here, the third electrode 223 was formed by depositing Mg of 3,500 Å.

A test example III which is a comparative example corresponds to a case in which the capping layer 224 and the third electrode 223 were not formed in a display having a size of 19 inches.

A test example IV which is a comparative example corresponds to a case in which the capping layer 224 and the third electrode 223 were not formed in a display having a size of 40 inches.

As illustrated in FIG. 15, it is possible to see that an amount of a voltage drop of the second electrode 222 in the test examples I and II is significantly less than an amount of a voltage drop of the second electrode 222 in the test examples III and IV.

Although the one or more embodiments of the present invention are described with respect to the top emission type organic light emitting display device, the one or more embodiments are not limited thereto and thus may be equally applied to a bottom emission type organic light emitting display device in which an image is realized toward the substrate 1, and a dual-emission type organic light emitting display device in which an image is realized in both directions.

According to the one or more embodiments of the present invention, it is possible to achieve effects as stated below.

The third electrode may be naturally patterned due to the capping layer, so that it is not necessary to perform a separate patterning process so as to form the third electrode. Thus, it is possible to prevent the second electrode from being damaged due to the pattering process with respect to the third electrode.

Also, the second electrode may be protected due to the capping layer.

A voltage drop of the second electrode may be prevented due to the third electrode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
a substrate;
a thin film transistor (TFT) formed on the substrate;
a first insulating layer covering the TFT;
a first electrode formed on the first insulating layer and electrically connected to the TFT;
a second insulating layer formed on the first insulating layer so as to cover the first electrode, the second insulating layer having an opening to expose a portion of the first electrode;
an organic layer formed on a portion of the second insulating layer and the first electrode;

a second electrode formed on the second insulating layer and the organic layer, the second electrode composed of a first region and a second region;

a capping layer formed on the first region of the second electrode, the capping layer having first edges; and a third electrode formed on the second region of the second electrode, the third electrode having second edges whose side surfaces contact side surfaces of the first edges of the capping layer;

the third electrode and the capping layer not overlapping each other in a direction perpendicular to a major surface of the substrate, or the third electrode overlapping the capping layer in the direction perpendicular to the major surface of the substrate and including a first portion contacting the first edges of the capping layer and a second portion connected to the first portion, and a thickness of the first portion of the third electrode being greater than a thickness of the second portion of the third electrode.

2. The organic light emitting display device of claim 1, wherein the second electrode is light-transmissive.

3. The organic light emitting display device of claim 1, wherein the second electrode comprises Ag.

4. The organic light emitting display device of claim 1, wherein the second electrode comprises ITO, IZO, ZnO, or $In_2O_3$.

5. The organic light emitting display device of claim 1, wherein a thickness of the third electrode is greater than a thickness of the second electrode.

6. The organic light emitting display device of claim 1, wherein the first region includes a transmission region capable of transmitting external light and a pixel region that is adjacent to the transmission region and in which emission occurs;

the first electrode overlaps with the pixel region; and the first electrode is positioned so as to block the TFT.

7. The organic light emitting display device of claim 1, wherein the capping layer is light-transmissive.

8. The organic light emitting display device of claim 1, wherein adhesion strength between the third electrode and the capping layer is less than adhesion strength between the third electrode and the second electrode.

9. The organic light emitting display device of claim 8, wherein the third electrode comprises Mg.

10. An organic light emitting display device, comprising:
a substrate;
a thin film transistor (TFT) formed on the substrate;
a first insulating layer covering the TFT;
a first electrode formed on the first insulating layer and electrically connected to the TFT;
a second insulating layer formed on the first insulating layer so as to cover the first electrode, the second insulating layer having an opening to expose a portion of the first electrode;
an organic layer formed on a portion of the second insulating layer and the first electrode;
a second electrode formed on the second insulating layer and the organic layer, the second electrode composed of a first region and a second region;
a capping layer formed on the first region of the second electrode, the capping layer having first edges; and
a third electrode formed on the second region of the second electrode, the third electrode having second edges whose side surfaces contact side surfaces of the first edges of the capping layer, adhesion strength between the third electrode and the capping layer being less than adhesion strength between the third electrode and the second electrode, and the capping layer comprising 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

11. An organic light emitting display device, comprising:
a plurality of pixels;
a plurality of thin film transistors (TFTs) positioned in each of the plurality of pixels;
a plurality of first electrodes positioned in the each of the plurality of pixels and electrically connected to the plurality of TFTs, respectively;
a second electrode covering the plurality of pixels;
an organic layer disposed between each of the plurality of first electrodes and the second electrode;
a plurality of discrete capping layers, each overlapping at least one of the plurality of pixels; and
a third electrode positioned between the plurality of pixels, the third electrode being adjacent to each of the plurality of capping layers and electrically connected to the second electrode.

12. The organic light emitting display device of claim 11, wherein the second electrode is light-transmissive.

13. The organic light emitting display device of claim 11, wherein the second electrode comprises Ag.

14. The organic light emitting display device of claim 11, wherein the second electrode comprises ITO, IZO, ZnO, or $In_2O_3$.

15. The organic light emitting display device of claim 11, wherein a thickness of the third electrode is greater than a thickness of the second electrode.

16. The organic light emitting display device of claim 11, wherein the each of the plurality of pixels comprises a transmission region capable of transmitting external light, and a pixel region that is adjacent to the transmission region and in which emission occurs;

each of the plurality of first electrodes overlaps with a pixel region, respectively; and each of the plurality of first electrodes is positioned so as to block the plurality of TFTs, respectively.

17. The organic light emitting display device of claim 11, wherein the plurality of capping layers are light-transmissive.

18. The organic light emitting display device of claim 11, wherein adhesion strength between the third electrode and the plurality of capping layers is less than adhesion strength between the third electrode and the second electrode.

19. The organic light emitting display device of claim 18, wherein the third electrode comprises Mg.

20. The organic light emitting display device of claim 11, wherein edges of each of the plurality of capping layers contact edges of the third electrode.

21. The organic light emitting display device of claim 11, wherein an area of each of the plurality of capping layers is larger than an area of a region in each of the plurality of pixels, wherein emission occurs in the region.

22. The organic light emitting display device of claim 11, wherein the third electrode and the plurality of capping layers do not overlap each other in a direction perpendicular to a major surface of a substrate on which the organic light emitting display device is formed.

23. The organic light emitting display device of claim 11, wherein the third electrode includes a plurality of first portions each respectively overlapping one of the plurality of capping layers in a direction perpendicular to a major surface of a substrate on which the organic light emitting display device is formed and at least one second portion connected to the plurality of the first portions, a thickness of the plurality of the first portions of the third electrode being less than a thickness of the second portion of the third electrode.

24. An organic light emitting display device, comprising:
a plurality of pixels;
a plurality of thin film transistors (TFTs) positioned in each of the plurality of pixels;
a plurality of first electrodes positioned in the each of the plurality of pixels and electrically connected to the plurality of TFTs, respectively;
a second electrode covering the plurality of pixels;
an organic layer disposed between each of the plurality of first electrodes and the second electrode;
a plurality of capping layers, each being positioned so as to correspond to at least one of the plurality of pixels; and
a third electrode positioned between the plurality of pixels, the third electrode being adjacent to each of the plurality of capping layers and electrically connected to the second electrode,
adhesion strength between the third electrode and the plurality of capping layers being less than adhesion strength between the third electrode and the second electrode, and
each of the plurality of capping layers comprising 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

25. A method of manufacturing an organic light emitting display device, the method comprising:
forming a plurality of thin film transistors (TFTs) positioned in each of a plurality of pixels;
forming a plurality of first electrodes positioned in the each of the plurality of pixels and electrically connected to the plurality of TFTs, respectively;
forming an organic layer on the plurality of pixels;
forming a second electrode covering the plurality of pixels so that the organic layer is disposed between each of the plurality of first electrodes and the second electrode;
forming a plurality of discrete capping layers, each overlapping at least one of the plurality of pixels; and
forming a third electrode positioned between the plurality of pixels, the third electrode being adjacent to each of the plurality of capping layers and electrically connected to the second electrode.

26. The method of claim 25, wherein the second electrode is light-transmissive.

27. The method of claim 25, wherein the second electrode comprises Ag.

28. The method of claim 25, wherein the second electrode comprises ITO, IZO, ZnO, or $In_2O_3$.

29. The method of claim 25, wherein the third electrode is formed to have a greater thickness than the second electrode.

30. The method of claim 25, wherein the each of the plurality of pixels comprises a transmission region capable of transmitting external light, and a pixel region that is adjacent to the transmission region and in which emission occurs;
the first electrode overlaps with the pixel region; and
the first electrode is positioned so as to block the plurality of TFTs.

31. The method of claim 25, wherein the plurality of capping layers are light-transmissive.

32. The method of claim 25, wherein adhesion strength between a material to form the third electrode and the plurality of capping layers is less than adhesion strength between the material to form the third electrode and the second electrode.

33. The method of claim 32, wherein each of the plurality of capping layers comprises 8-Quinolinolato Lithium (Liq), N,N-diphenyl-N,N-bis(9-phenyl-9H-carbazol-3-yl)biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

34. The method of claim 32, wherein the third electrode comprises Mg.

35. The method of claim 25, wherein the formation of the plurality of capping layers comprises using a mask having an opening with a pattern that corresponds to the plurality of capping layers.

36. The method of claim 25, wherein the formation of the third electrode comprises depositing a metal on the plurality of capping layers and on regions adjacent to the plurality of capping layers.

37. The method of claim 25, wherein an area of each of the plurality of capping layers is larger than an area of a region in each of the plurality of pixels, wherein emission occurs in the region.

* * * * *